United States Patent
Steuer et al.

(10) Patent No.: US 10,281,503 B2
(45) Date of Patent: May 7, 2019

(54) NON-CONTACT VOLTAGE MEASUREMENT SYSTEM USING MULTIPLE CAPACITORS

(71) Applicant: Fluke Corporation, Everett, WA (US)

(72) Inventors: Ronald Steuer, Hinterbruhl (AT); Peter Radda, Vitis (AT)

(73) Assignee: Fluke Corporation, Everett, WA (US)

( * ) Notice: Subject to any disclaimer, the term of this patent is extended or adjusted under 35 U.S.C. 154(b) by 139 days.

(21) Appl. No.: 15/412,891

(22) Filed: Jan. 23, 2017

(65) Prior Publication Data

US 2018/0136263 A1     May 17, 2018

Related U.S. Application Data

(60) Provisional application No. 62/421,124, filed on Nov. 11, 2016.

(51) Int. Cl.
| | |
|---|---|
| G01R 19/25 | (2006.01) |
| G01R 1/22 | (2006.01) |
| G01R 15/14 | (2006.01) |
| G01R 15/16 | (2006.01) |
| G01R 19/00 | (2006.01) |

(52) U.S. Cl.
CPC .......... *G01R 19/2503* (2013.01); *G01R 1/22* (2013.01); *G01R 15/14* (2013.01); *G01R 15/142* (2013.01); *G01R 15/16* (2013.01); *G01R 19/00* (2013.01)

(58) Field of Classification Search
CPC ............. G06Q 20/385; G06Q 20/4018; G06Q 20/3276; G06K 7/1417
See application file for complete search history.

(56) References Cited

U.S. PATENT DOCUMENTS

| | | | |
|---|---|---|---|
| 4,709,339 A | | 11/1987 | Fernandes |
| 5,124,642 A | * | 6/1992 | Marx ............... G01R 15/18 174/139 |
| 5,349,289 A | * | 9/1994 | Shirai .............. G01R 1/22 324/116 |

(Continued)

FOREIGN PATENT DOCUMENTS

| | | |
|---|---|---|
| EP | 1 249 706 B1 | 9/2007 |
| JP | 2006-242855 A | 9/2006 |

(Continued)

OTHER PUBLICATIONS

Tsang et al., "Dual capacitive sensors for non-contact AC voltage measurement," *Sensors and Actuators A* 167:261-266, 2011.

(Continued)

*Primary Examiner* — Tung X Nguyen
*Assistant Examiner* — Dominic E Hawkins
(74) *Attorney, Agent, or Firm* — Seed IP Law Group LLP

(57) ABSTRACT

Systems and methods for measuring alternating current (AC) voltage of an insulated conductor (e.g., insulated wire) are provided, without requiring a galvanic connection between the conductor and a test electrode or probe. A non-galvanic contact (or "non-contact") voltage measurement system includes a plurality of conductive sensors which capacitively couple with the insulated conductor. At least one processor receives signals indicative of the voltages at the conductive sensors due to the AC voltage in the insulated conductor, and determines the AC voltage in the insulated conductor based at least in part on the received signals.

27 Claims, 6 Drawing Sheets

(56) References Cited

U.S. PATENT DOCUMENTS

| | | | |
|---|---|---|---|
| 5,473,244 A | 12/1995 | Libove et al. | |
| 5,583,444 A | 12/1996 | Nakamura et al. | |
| 5,973,501 A | 10/1999 | Reichard | |
| 6,014,027 A | 1/2000 | Reichard | |
| 6,043,640 A * | 3/2000 | Lauby | G01R 15/125 324/117 H |
| 6,091,237 A | 7/2000 | Chen | |
| 6,118,270 A | 9/2000 | Singer et al. | |
| 6,664,708 B2 | 12/2003 | Shlimak et al. | |
| 6,812,685 B2 | 11/2004 | Steber et al. | |
| 6,825,649 B2 | 11/2004 | Nakano | |
| 7,084,643 B2 | 8/2006 | Howard et al. | |
| 7,164,263 B2 * | 1/2007 | Yakymyshyn | G01R 15/207 324/117 H |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,330,449 B2 | 12/2012 | Greenberg | |
| 8,680,845 B2 | 3/2014 | Carpenter et al. | |
| 8,755,210 B2 * | 6/2014 | Kangas | H02J 13/002 363/157 |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 9,615,147 B2 * | 4/2017 | Radosavljevic | H04Q 9/00 |
| 9,651,584 B2 * | 5/2017 | Gunn | G01R 19/0046 |
| 2002/0167303 A1 | 11/2002 | Nakano | |
| 2007/0086130 A1 | 4/2007 | Sorensen | |
| 2010/0090682 A1 | 4/2010 | Armstrong | |
| 2010/0283539 A1 | 11/2010 | Yanagisawa | |
| 2012/0259565 A1 | 10/2012 | Oshima et al. | |
| 2013/0076343 A1 | 3/2013 | Carpenter et al. | |
| 2014/0035607 A1 | 2/2014 | Heydron et al. | |
| 2014/0062459 A1 | 3/2014 | El-Essawy et al. | |
| 2014/0268953 A1 * | 9/2014 | Patel | H02M 7/217 363/89 |
| 2015/0002138 A1 | 1/2015 | Fox | |
| 2015/0305805 A1 * | 10/2015 | Xiao | A61B 18/1482 606/39 |
| 2016/0047846 A1 | 2/2016 | Sharma et al. | |
| 2016/0109486 A1 | 4/2016 | Yanagisawa | |
| 2016/0187389 A1 * | 6/2016 | Kshirsagar | G01R 19/0053 324/76.11 |

FOREIGN PATENT DOCUMENTS

| | | |
|---|---|---|
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2012-137496 A | 7/2012 |
| JP | 2012-177571 A | 9/2012 |
| JP | 2014-44168 A | 3/2014 |
| JP | 2014-44169 A | 3/2014 |
| JP | 2014-106220 A | 6/2014 |
| JP | 2016-3997 A | 1/2016 |

OTHER PUBLICATIONS

HIOKI, "3258: Safety HiTESTER," Revised Edition 5, HIOKI E. E. Corporation, Nagano Japan, 2 pages.

Mitchell Instrument Company Inc., clipping from the Mitchell Catalogue, undated, 1 page.

Takahashi, "Clamp on Power Logger PW3365 : Safety Voltage Sensor PW9020," *HIOKI Technical Notes* 1(1): 2015, 8 pages.

* cited by examiner

NON-CONTACT VOLTAGE MEASUREMENT SYSTEM USING MULTIPLE CAPACITORS

BACKGROUND

Technical Field

The present disclosure generally relates to measurement of electrical characteristics, and more particularly, to non-contact measurement of alternating current (AC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage detector is commonly used to detect the presence of alternating current (AC) voltage, typically high voltage, without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A system to measure alternating current (AC) voltage in an insulated conductor may be summarized as including: a housing; a sensor assembly physically coupled to the housing, the sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling; a voltage measurement subsystem electrically coupled to the first, second and third conductive sensors, wherein the voltage measurement subsystem, in operation, generates first, second and third sensor voltage signals that are indicative of voltages at the first, second and third conductive sensors, respectively; and at least one processor communicatively coupled to the voltage measurement subsystem, wherein, in operation, the at least one processor: receives the first, second and third sensor voltage signals from the voltage measurement subsystem; and determines the AC voltage in the insulated conductor based at least in part on the received first, second and third sensor voltage signals.

The at least one characteristic which affects capacitive coupling may include at least one physical dimension. The at least one characteristic which affects capacitive coupling may include at least one of physical area, physical orientation, or physical separation from the insulated conductor when the sensor assembly is positioned proximate the insulated conductor. Each of the first and second conductive sensors may have a planar right triangular shape which defines a first edge and a second edge that form a right angle, and a hypotenuse edge opposite the right angle, and the hypotenuse edges of the first conductive sensor and the second conductive sensor may be positioned proximate each other. The third conductive sensor may have a planar rectangular shape. The first and second conductive sensors may be positioned in a first plane and the third conductive sensor may be positioned in a second plane, and the first plane may be disposed at an acute angle with respect to the second plane. The first plane may be disposed at an angle with respect to the second plane which may be between 20 degrees and 50 degrees. The sensor assembly may include: a first insulation layer which insulates the first and second conductive sensors from the insulated conductor when the sensor assembly is positioned proximate the insulated conductor, the first insulation layer having a first thickness; and a second insulation layer which insulates the third conductive sensor from the insulated conductor when the sensor assembly is positioned proximate the insulated conductor, the second insulation layer having a second thickness that is different from the first thickness. The first thickness of the first insulation layer may be less than the second thickness of the second insulation layer.

The system to measure alternating current (AC) voltage in an insulated conductor may further include at least one internal ground guard which at least partially surrounds each of the first, second and third conductive sensors.

The at least one processor may determine at least one of: the first sensor voltage signal divided by the second sensor voltage signal; the sum of the first sensor voltage signal and the second sensor voltage signal; and the sum of the first sensor voltage signal, second sensor voltage signal and the third sensor voltage signal. The at least one processor may determine the sum of the first sensor voltage signal and the second sensor voltage signal divided by the third sensor voltage signal. The at least one processor may compare at least one value derived from the first, second and third sensor voltage signals to a lookup table to determine the AC voltage in the insulated conductor based at least in part on the received first, second and third sensor voltage signals. The at least one processor may evaluate at least one equation using at least one value derived from the first, second and third sensor voltage signals to determine the AC voltage in the insulated conductor based at least in part on the received first, second and third sensor voltage signals.

A method of operating a system to measure alternating current (AC) voltage in an insulated conductor may be summarized as including a housing, a sensor assembly physically coupled to the housing, the sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling, the method including: generating, via a voltage measurement subsystem electrically coupled to the first, second and third conductive sensors, first, second and third sensor voltage signals that are indicative of voltages at the first, second and third conductive sensors, respectively; receiving, by at least one processor communicatively coupled to the voltage measurement subsystem, the first, second and third sensor voltage signals from the voltage measurement subsystem; and determining, by the at least one processor, the AC voltage in the insulated conductor based at least in part on the received first, second and third sensor voltage signals.

Determining the AC voltage in the insulated conductor may include determining at least one of: the first sensor voltage signal divided by the second sensor voltage signal; the sum of the first sensor voltage signal and the second sensor voltage signal; and the sum of the first sensor voltage signal, second sensor voltage signal and the third sensor voltage signal. Determining the AC voltage in the insulated conductor may include determining the sum of the first sensor voltage signal and the second sensor voltage signal divided by the third sensor voltage signal. Determining the AC voltage in the insulated conductor may include comparing at least one value derived from the first, second and third sensor voltage signals to a lookup table to determine the AC voltage in the insulated conductor based at least in part on the received first, second and third sensor voltage signals. Determining the AC voltage in the insulated conductor may include evaluating at least one equation using at least one value derived from the first, second and third sensor voltage signals to determine the AC voltage in the insulated conductor based at least in part on the received first, second and third sensor voltage signals.

A method of providing a system to measure alternating current (AC) voltage in an insulated conductor may be summarized as including: providing a sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling; generating, via a voltage measurement subsystem electrically coupled to the first, second and third conductive sensors, first, second and third sensor voltage signals that are indicative of voltages at the first, second and third conductive sensors, respectively; receiving, by at least one processor communicatively coupled to the voltage measurement subsystem, the first, second and third sensor voltage signals from the voltage measurement subsystem; and determining, by the at least one processor, the AC voltage in the insulated conductor based at least in part on the received first, second and third sensor voltage signals.

Providing a sensor assembly may include providing a sensor assembly that includes first, second and third conductive sensors, and each of the first, second and third conductive sensors may differ from the other of the conductive sensors with respect to at least one physical dimension. Providing a sensor assembly may include providing a sensor assembly that includes first, second and third conductive sensors, and each of the first, second and third conductive sensors may differ from the other of the conductive sensors with respect to at least one of physical area, physical orientation, or physical separation from the insulated conductor when the sensor assembly is positioned proximate the insulated conductor. Providing a sensor assembly may include providing a sensor assembly that includes first, second and third conductive sensors, and each of the first and second conductive sensors may have a planar right triangular shape which defines a first edge and a second edge that form a right angle, and a hypotenuse edge opposite the right angle, and the hypotenuse edges of the first conductive sensor and the second conductive sensor may be positioned proximate each other. Providing a sensor assembly may include providing a sensor assembly that includes first, second and third conductive sensors, and the third conductive sensor may have a planar rectangular shape. Providing a sensor assembly may include providing a sensor assembly that includes first, second and third conductive sensors, and the first and second conductive sensors may be positioned in a first plane and the third conductive sensor may be positioned in a second plane, and the first plane may be disposed at an acute angle with respect to the second plane.

The method of providing a system to measure alternating current (AC) voltage in an insulated conductor may further include: providing a first insulation layer which insulates the first and second conductive sensors from the insulated conductor when the sensor assembly is positioned proximate the insulated conductor, the first insulation layer having a first thickness; and providing a second insulation layer which insulates the third conductive sensor from the insulated conductor when the sensor assembly is positioned proximate the insulated conductor, the second insulation layer having a second thickness that is different from the first thickness.

The method of providing a system to measure alternating current (AC) voltage in an insulated conductor may further include providing at least one internal ground guard which at least partially surrounds each of the first, second and third conductive sensors.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure are directed to systems and methods for measuring alternating current (AC) voltage of an insulated or blank uninsulated conductor (e.g., insulated wire) without requiring a galvanic connection between the conductor and a test electrode or probe. Generally, a non-galvanic contact (or "non-contact") voltage measurement system is provided which measures an AC voltage signal in an insulated conductor with respect to ground using a plurality of capacitive sensors. Such systems which do not require a galvanic connection are referred to herein as "non-contact." As used herein, "electrically coupled" includes both direct and indirect electrical coupling unless stated otherwise.

Figure 1A:
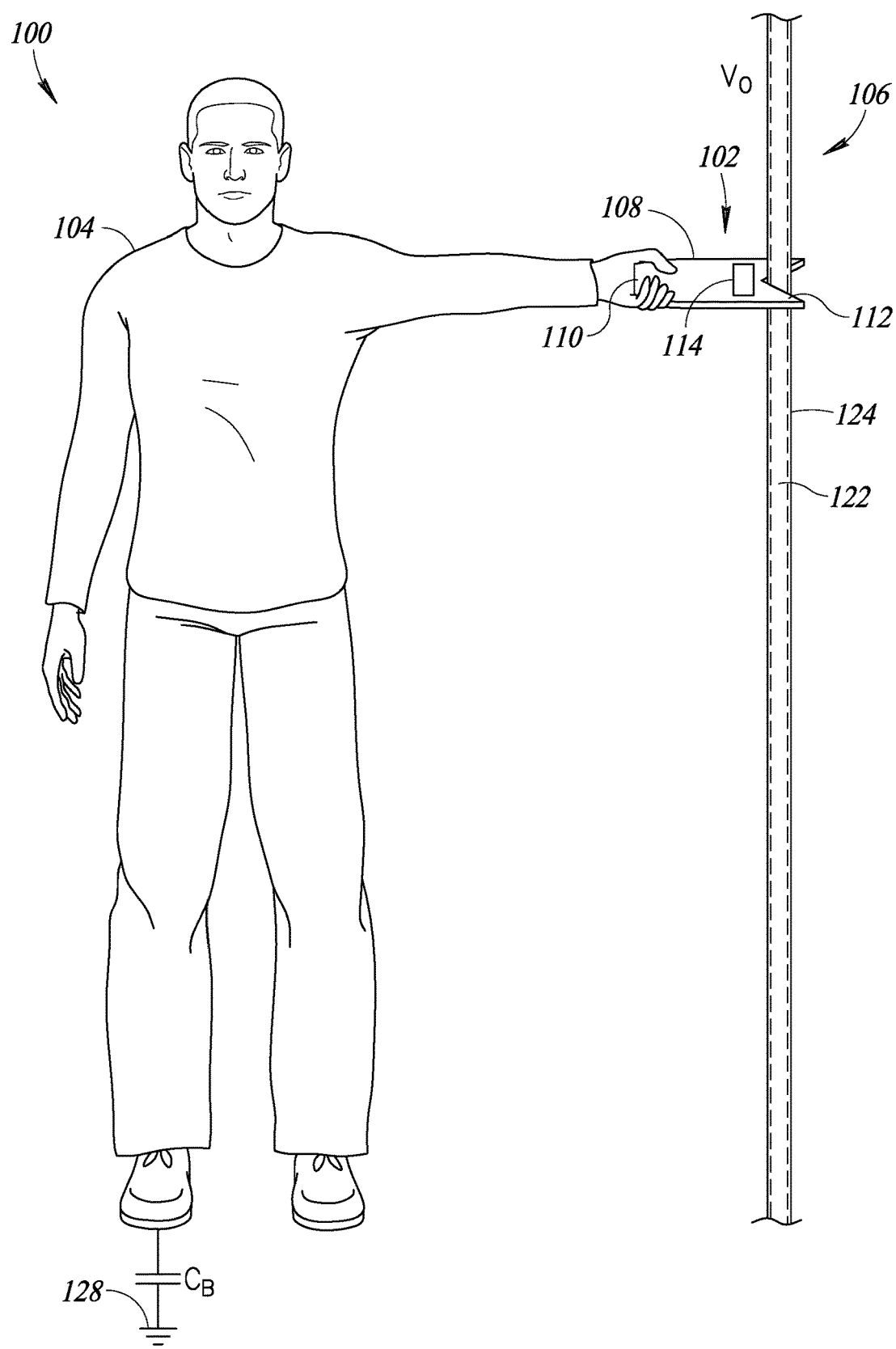
FIG. 1A is a pictorial diagram of an environment in which a non-contact voltage measurement system may be used by an operator to measure AC voltage present in an insulated wire without requiring galvanic contact with the wire, according to one illustrated implementation.
Figure 1B:
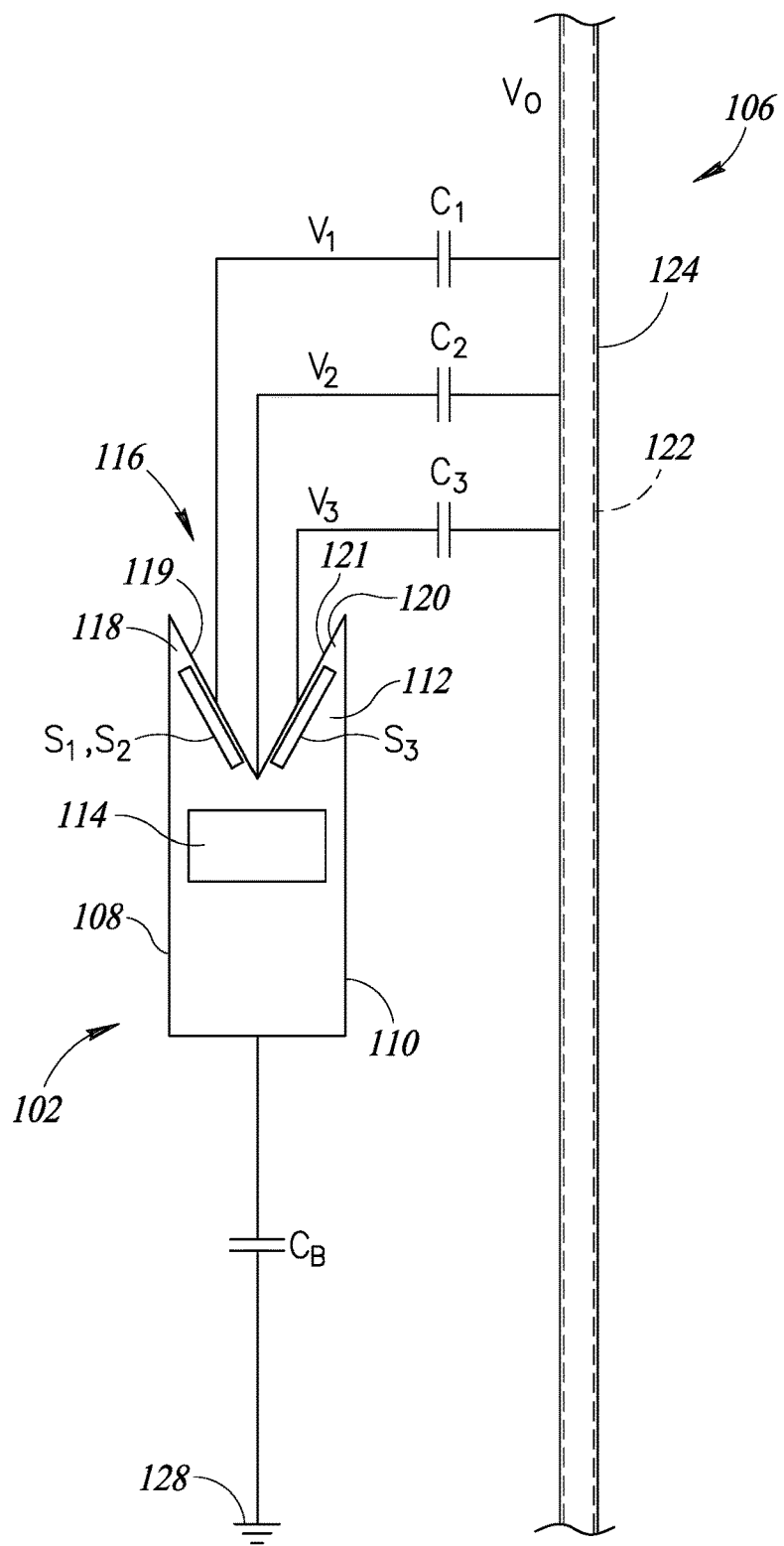
FIG. 1B is a top view of the non-contact voltage measurement system of FIG. 1A, showing coupling capacitances formed between the insulated wire and conductive sensors of the non-contact voltage measurement system, according to one illustrated implementation.

FIG. 1A is a pictorial diagram of an environment 100 in which a non-contact voltage measurement system 102 of the present disclosure may be used by an operator 104 to measure AC voltage present in an insulated wire 106 without requiring galvanic contact between the non-contact voltage measurement system and the wire 106. FIG. 1B is a top plan view of the non-contact voltage measurement system 102 of FIG. 1A, showing various electrical characteristics of the non-contact voltage measurement system during operation. The non-contact voltage measurement system 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement system 102. The user interface 114 may include any number of inputs (e.g., buttons, dials, switches, touch sensor) and any number of outputs (e.g., display, LEDs, speakers, buzzers). The non-contact voltage measurement system 102 may also include one or more wired and/or wireless communications interfaces (e.g., USB, Wi-Fi®, Bluetooth®) to facilitate communication with other local or remotely-located devices.

In at least some implementations, as shown best in FIG. 1B, the probe portion 112 may include a recessed portion 116 defined by first and second extended portions 118 and 120. The recessed portion 116 receives the insulated wire 106 (see FIG. 1A) when a measurement is performed. The insulated wire 106 includes a conductor 122 and an insulator 124 surrounding the conductor 122. The recessed portion 116 may include sensors or electrodes $S_1$, $S_2$ and $S_3$ which are positioned proximate the insulator 124 of the insulated wire 106 when the insulated wire is positioned within the recessed portion 116 of the non-contact voltage measurement system 102. In the illustrated example, the sensors $S_1$ and $S_2$ are disposed inside the extended portion 118 of the housing 108, and the sensor $S_3$ is disposed inside the extended portion 120. A surface 119 of the extended portion 119 may be provided to separate the sensors $S_1$ and $S_2$ from the recessed portion 116 to prevent physical and electrical contact between the sensors and other objects (e.g., the insulated wire 106, metal objects). Similarly, a surface 121 of the extended portion 120 may separate the sensor $S_3$ from the recessed portion 116. As discussed further below with reference to FIG. 5, in at least some implementations the surface 119 may separate the sensors $S_1$ and $S_2$ from the recessed portion 116 by a distance (e.g., thickness $T_1$ of FIG. 5) which is different from a distance (e.g., thickness $T_2$ of FIG. 5) that the surface 121 separates the sensor $S_3$ from the recessed portion.

As shown in FIG. 1A, in use the operator 104 may grasp the grip portion 110 of the housing 108 and place the probe portion 112 proximate the insulated wire 106 so that the non-contact voltage measurement system 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor assembly of the non-contact voltage measurement system 102 to be positioned proximate the insulated wire 106.

When the probe portion 112 is positioned proximate the insulated wire 106, the sensors $S_1$, $S_2$ and $S_3$ each capacitively couple with the conductor 122 of the wire, generating capacitances $C_1$, $C_2$ and $C_3$, respectively. As discussed further below, each of the sensors $S_1$, $S_2$ and $S_3$ differs from each other with respect to at least one characteristic that affects capacitive coupling with the insulated wire 106, such that the different voltages $V_1$, $V_2$ and $V_3$ at the sensors $S_1$, $S_2$ and $S_3$ may be detected and used to accurately determine the AC voltage ($V_O$) in the insulated wire 106.

In at least some implementations, various ratios between the output voltages $V_1$, $V_2$ and $V_3$ are used to determine the insulated conductor's 106 characteristics. Using the determined characteristics, the AC voltage in the insulated conductor 106 may be determined via a calibrated lookup table and/or one or more determined equations.

The particular systems and methods used by the non-contact voltage measurement system 102 to measure AC voltage are discussed below with reference to FIGS. 2-5.

Figure 2:
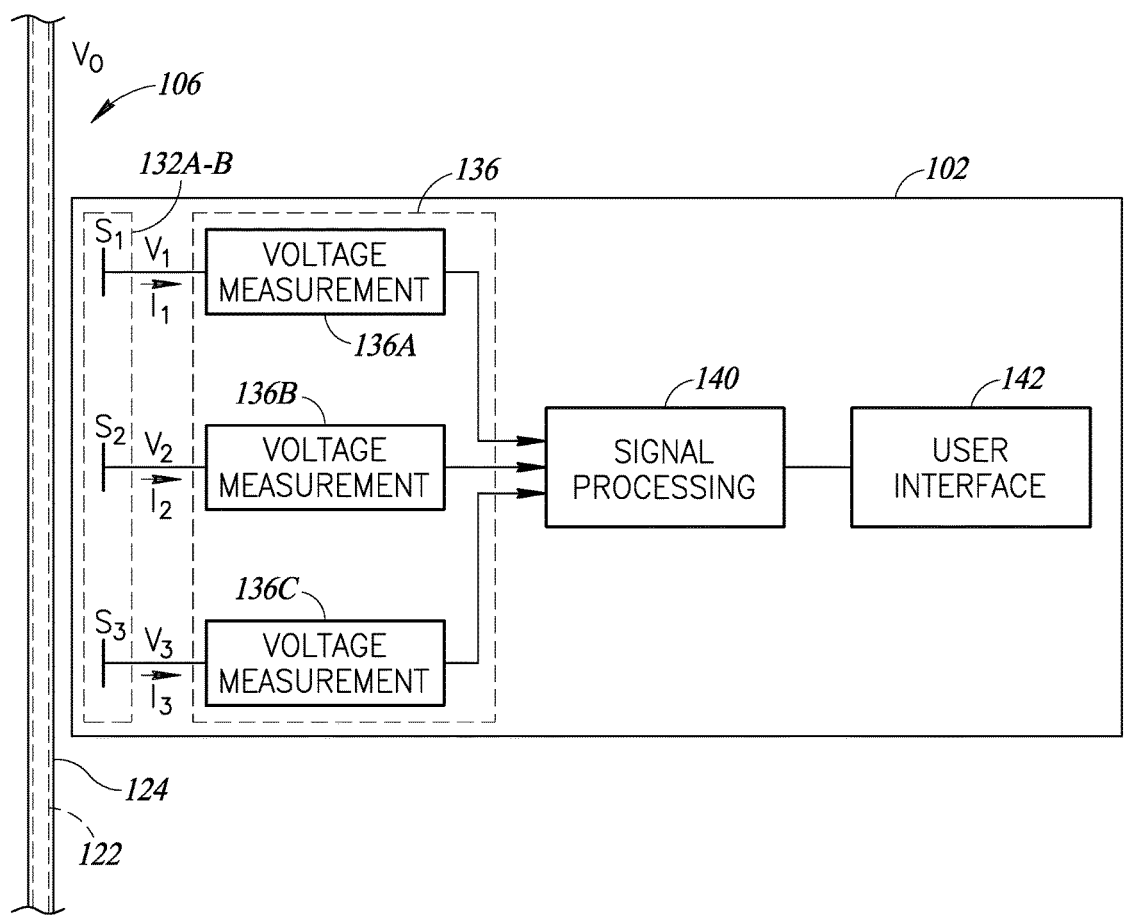
FIG. 2 is a schematic diagram of various internal components of the non-contact voltage measurement system, according to one illustrated implementation.

FIG. 2 shows a schematic diagram of various internal components of the non-contact voltage measurement system 102 also shown in FIGS. 1A and 1B. In this example, the conductive sensors $S_1$, $S_2$ and $S_3$ of the non-contact voltage measurement system 102 are positioned proximate the insulated wire 106 under test. Each of the sensors $S_1$, $S_2$ and $S_3$ capacitively couples with the conductor 122 of the insulated wire 106, forming the sensor coupling capacitors $C_1$, $C_2$ and $C_3$ (FIG. 1B), respectively. The AC voltage signal ($V_O$) in the wire 122 generates sensor voltage signals $V_1$, $V_2$ and $V_3$ at the sensors $S_1$, $S_2$ and $S_3$, respectively, which voltage signals are dependent on the coupling capacitances $C_1$, $C_2$ and $C_3$ for the respective sensors $S_1$, $S_2$ and $S_3$.

The AC voltage ($V_O$) in the wire 122 to be measured has a connection to an external ground 128 (e.g., neutral). The non-contact voltage measurement system 102 itself also has a capacitance to ground 128, which consists primarily of the body capacitance ($C_B$) when the operator 104 (FIG. 1) holds the non-contact voltage measurement system in his hand. Each of the capacitances $C_1$, $C_2$ and $C_3$ creates a conductive loop through $C_B$ and the voltage inside the loop generates respective signal currents ($I_1$, $I_2$ and $I_3$). The current signals ($I_1$, $I_2$ and $I_3$) are generated by the AC voltage signal ($V_O$) in the conductor 122 of the insulated wire 106 which is capacitively coupled to the conductive sensors $S_1$, $S_2$ and $S_3$, respectively, and loop back to the external ground 128 through the housing 108 of the non-contact voltage measurement system 102 and the body capacitor ($C_B$) to ground 128. The current signals ($I_1$, $I_2$ and $I_3$) are each dependent on the distance between the conductive sensor $S_1$, $S_2$ and $S_3$, respectively, and the insulated wire 106 under test, the particular shapes and sizes of the conductive sensor $S_1$, $S_2$ and $S_3$, and the size, voltage level ($V_O$) and relative position of the conductor 122. The voltages $V_1$, $V_2$ and $V_3$ are proportional to the current signals $I_1$, $I_2$ and $I_3$, respectively. Any other reference potential relative to Ground (the body capacitance $C_B$) can also be used if there is a connection from and internal ground guard 154 (see FIGS. 3, 4A, 4B and 5) to the measured reference potential such as a test lead. This connection, if used, can also cancel the influence of low body capacitances $C_B$ if connected to ground/earth. An example would be phase-to-phase measurements in multi-phase environment connecting the internal ground guard 154 to one phase and using the non-contact sensor 112 for another phase.

To reduce or avoid stray currents, at least a portion of the non-contact voltage measurement system 102 (e.g., the sensors $S_1$, $S_2$ and $S_3$) may be at least partially surrounded by a conductive internal ground guard or screen 132A-B (also shown in FIGS. 4A-B) which causes most of the current to run through the conductive sensor $S_1$, $S_2$ and $S_3$ which form the coupling capacitors $C_1$, $C_2$ and $C_3$, respectively, with the conductor 122 of the insulated wire 106. The internal ground guards 132A-B may be formed from any suitable conductive material (e.g., copper) and may be solid (e.g., foil) or have one or more openings (e.g., mesh). The guards 132A-B around the sensors $S_1$, $S_2$ and $S_3$ may also reduce stray influences of adjacent wires close to the sensors. The guards 132A-B, also referred to by the reference numeral 154 in FIGS. 3, 4A, 4B and 5, provide an internal ground connection for the non-contact voltage measurement system 102.

As shown in FIG. 2, the non-contact voltage measurement system 102 may include a voltage measurement subsystem 136 which includes voltage measurement components 136A, 136B and 136C which are operative to detect the voltage signals $V_1$, $V_2$ and $V_3$, respectively, and/or the respective current signals $I_1$, $I_2$ and $I_3$ which are proportional to the voltage signals. As a non-limiting example, each of the voltage measurement components 136 may comprise an analog-to-digital converter (ADC) and associated circuitry to detect the voltage signals $V_1$, $V_2$ and $V_3$. As another non-limiting example, each of the voltage measurement components 136A, 136B and 136C may include an input amplifier and feedback circuitry which operates as an inverting current-to-voltage converter to convert the input currents $I_1$, $I_2$ and $I_3$, which are proportional to the voltage signals $V_1$, $V_2$ and $V_3$, into voltage levels.

The voltage signals $V_1$, $V_2$ and $V_3$ (or signals representative thereof) may be fed to a signal processing module 140 which, as discussed further below, processes the voltage signals $V_1$, $V_2$ and $V_3$ to determine the AC voltage ($V_O$) in the conductor 122 of the insulated wire 106. The signal processing module 140 may include any combination of digital and/or analog circuitry.

The non-contact voltage measurement system 102 may also include a user interface 142 (e.g., display) communicatively coupled to the signal processing module 140 to present the determined AC voltage ($V_O$) or to communicate by an interface to the operator 104 of the non-contact voltage measurement system.

Figure 3:
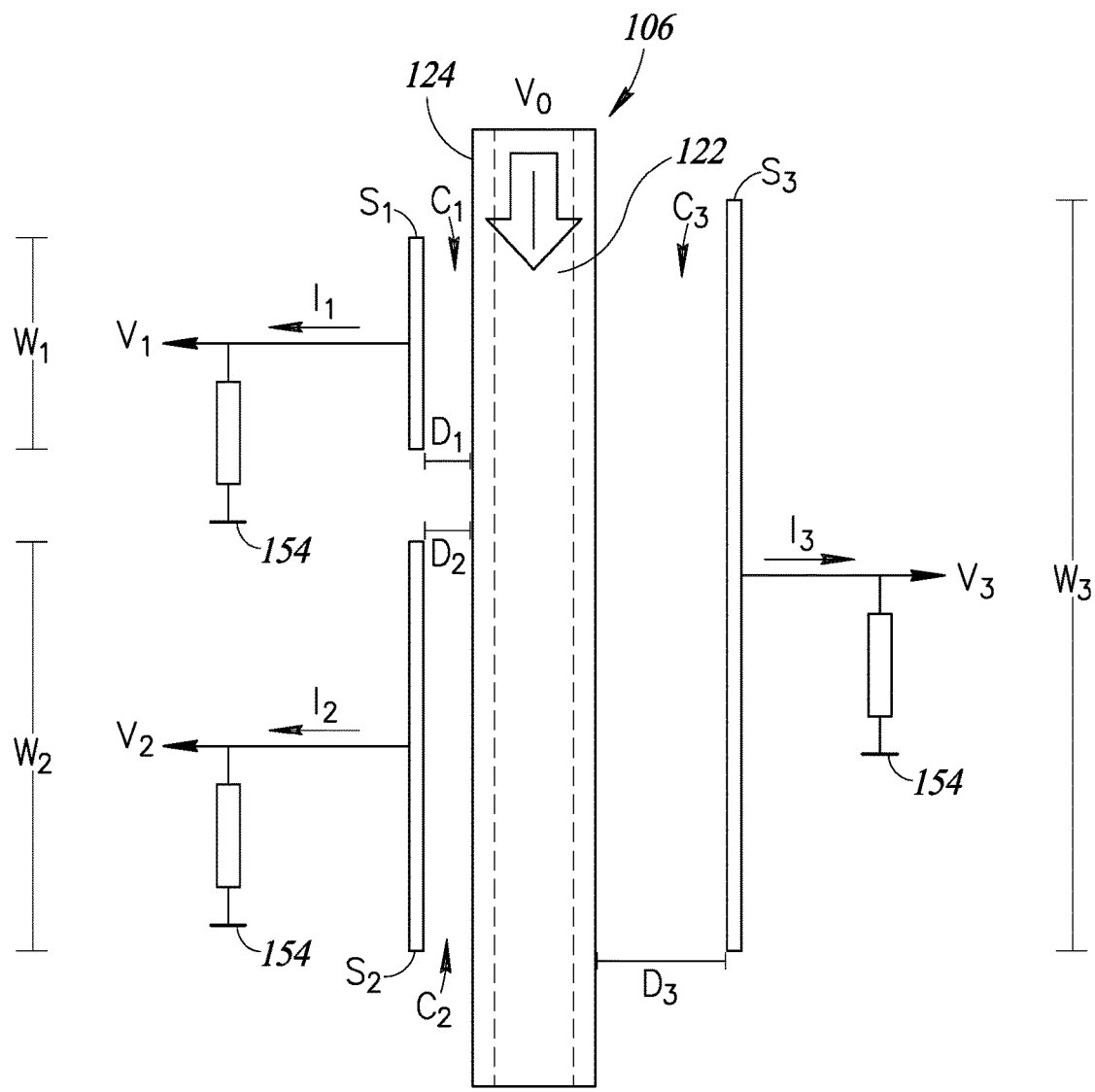
FIG. 3 is a schematic diagram which shows conductive sensors of the non-contact voltage measurement system positioned proximate an insulated wire under test, according to one illustrated implementation.
Figure 5:
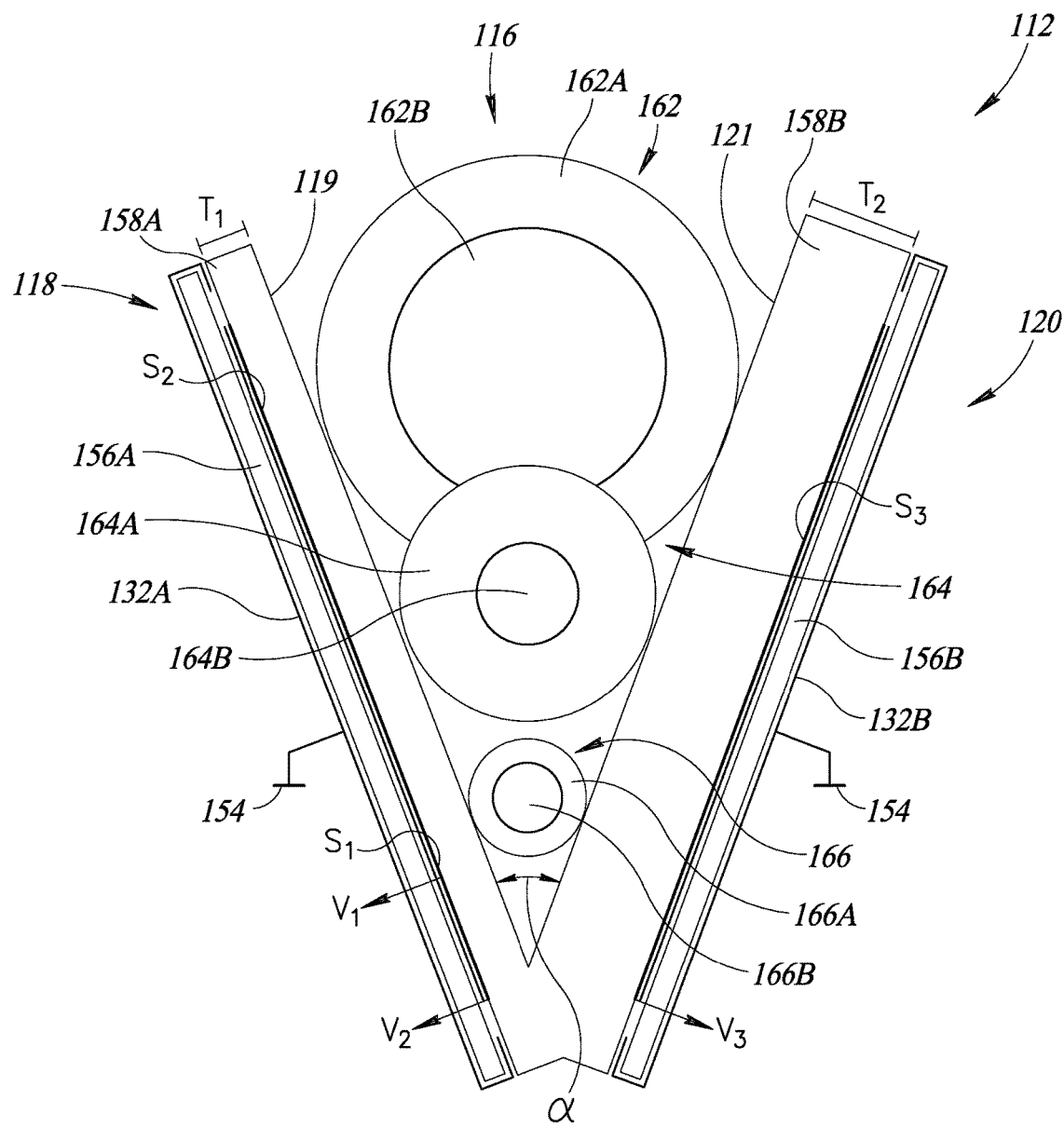
FIG. 5 is a sectional view of a frond end or probe end of the non-contact voltage measurement system, according to one illustrated implementation.

FIG. 3 is a schematic diagram which shows the conductive sensors $S_1$, $S_2$ and $S_3$ of the non-contact voltage measurement system 102 positioned proximate the insulated wire 106 during measurement of the insulated wire, according to one illustrated implementation. In this example, the conductive sensor $S_1$ is separated from the insulated wire 106 by a first distance $D_1$, the conductive sensor $S_2$ is separated from the insulated wire 106 by a second distance $D_2$, and the conductive sensor $S_3$ is separated from the insulated wire 106 by a third distance $D_3$. In at least some implementations, at least one of the distances $D_1$, $D_2$ and $D_3$ may be different from at least one other of the distances $D_1$, $D_2$ and $D_3$. For example, in at least some implementations the distances $D_1$ and $D_2$ may be equal to each other, and the distance $D_3$ may be different from the distances $D_1$ and $D_2$. As shown in FIG. 5, the distances $D_1$, $D_2$ and $D_3$ may be controlled at least in part by physical properties (e.g., thickness) of one or more insulation layers.

As also illustrated FIG. 3, the conductive sensors $S_1$, $S_2$ and $S_3$ may have different physical dimensions (e.g., height, width, shape, area). In the illustrated example, the conductive sensor $S_1$ has a width ($W_1$) that is less than a width ($W_2$) of the conductive sensor $S_2$, and the conductive sensor $S_2$ has a width ($W_2$) that is less than a width ($W_3$) of the conductive sensor $S_3$. Such differences between the sensors $S_1$, $S_2$ and $S_3$ allow for measurements of the voltages $V_1$, $V_2$ and $V_3$ to uniquely determine the AC voltage in the insulated wire.

Figures 4A, 4B:
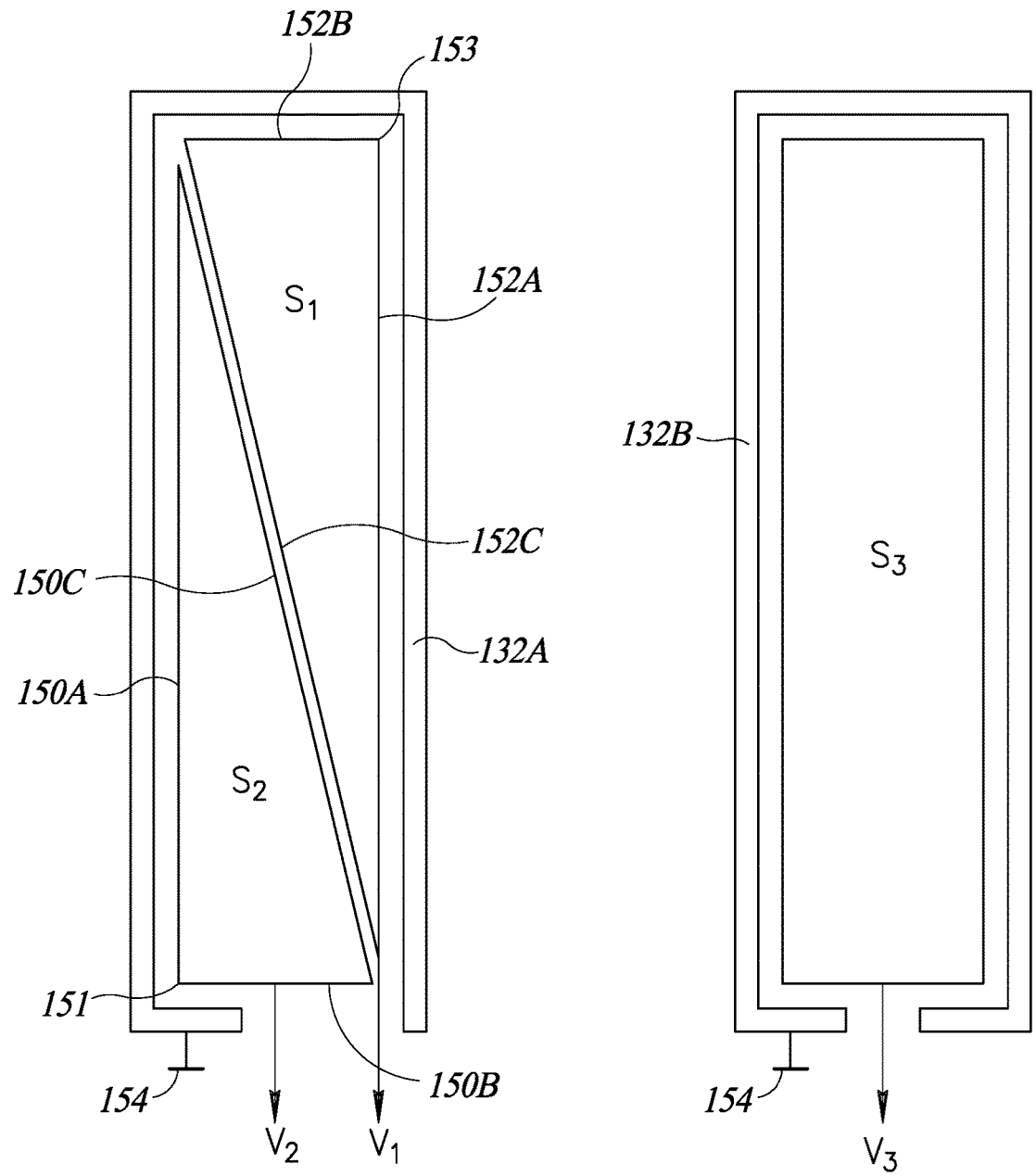
FIG. 4A is a plan view of first and second conductive sensors and an internal ground guard for the non-contact voltage measurement system which shows examples shapes for the first and second conductive sensors, according to one illustrated implementation.
FIG. 4B is a plan view of a third conductive sensor and an internal ground guard for the non-contact voltage measurement system which shows an example shape for the third conductive sensor, according to one illustrated implementation.

FIG. 4A is a plan view of the first and second conductive sensors $S_1$ and $S_2$ at least partially surrounded by the internal ground guard 132A. In this example, the sensor $S_1$ has a planar right triangular shape which defines a first edge 150A and a second edge 150B that form a right angle at a corner 151, and a hypotenuse edge 150C opposite the right angle. Similarly, the sensor $S_2$ has a planar right triangular shape which defines a first edge 152A and a second edge 152B that form a right angle at a corner 153, and a hypotenuse edge 152C opposite the right angle. In this example, the sensors $S_1$ and $S_2$ are inverted with respect to one another such that the hypotenuse edges 150C and 152C of the first and second conductive sensors $S_1$ and $S_2$, respectively, are positioned next to (e.g., substantially adjacent) each other with a small gap therebetween.

FIG. 4B is a plan view of the third conductive sensor $S_3$ at least partially surrounded by the internal ground guard 132B. In this example, the third conductive sensor $S_3$ is rectangular in shape. In at least some implementations, the area of the third sensor $S_3$ is the same (or substantially the same) as the combined area of the first and second conductive sensors $S_1$ and $S_2$, although such feature is not required. In instances where the third sensor $S_3$ is the same as the combined area of the first and second conductive sensors $S_1$ and $S_2$ and the sensors $S_1$ and $S_2$ are spaced apart from the insulated wire by a distance that is different from the distance which the sensor $S_3$ is spaced apart from the insulated wire, the combined sensors $S_1$ and $S_2$ may be considered as a single capacitance ($C_1+C_2$) which may be compared with the capacitance $C_3$ to account for the differences in the distances using similarly shaped capacitors.

It should be appreciated that the particular shapes, sizes, relative positions and orientations of the sensors $S_1$, $S_2$ and $S_3$ are illustrative and are not limiting. Indeed, the shapes, sizes, relative positions and orientations of each of the sensors $S_1$, $S_2$ and $S_3$ may be varied in numerous combinations.

FIG. 5 is a sectional view of the front end 112 of the non-contact voltage measurement system 102 which includes the sensors $S_1$, $S_2$ and $S_3$. The sensors $S_1$ and $S_2$ may be supported by a circuit board 156A, which is at least partially surrounded by the internal ground guard 132A. Similarly, the sensor $S_3$ may be supported by a circuit board 156B, which is at least partially surrounded by the internal ground guard 132B.

A first insulation layer 158A separates the sensors $S_1$ and $S_2$ from the recessed portion 118 of the front end 112. A second insulation layer 158B separates the sensor $S_3$ from the recessed portion 118 of the front end. The first and second insulation layers 158A and 158B may have planar surfaces 119 and 121, respectively, that are disposed at an acute angle (a) with respect to each other to define the "V" shaped recessed portion 116 which receives insulated conductors therein. As a non-limiting example, the angle (a) may be between 20 degrees and 50 degrees (e.g., 39 degrees, 42 degrees) in at least some implementations. Example insulated conductors 162, 164 and 166 are shown disposed within the recessed portion 116 adjacent the planar surfaces 119 and 121. The insulated conductor 162 includes a conductive wire 162B surrounded by insulation 162A, the insulated conductor 164 includes a conductive wire 164B surrounded by insulation 164A, and the insulated conductor 166 includes a conductive wire 166B surrounded by insulation 166A.

In the example shown in FIG. 5, the front end or probe end 112 is shaped to accommodate insulated wires of various diameters, such as the insulated wire 162 with a relatively large diameter or the insulated wire 166 with a relatively small diameter. The insulated wires 162, 164 and 166 may also have conductors 162A, 164A and 166A, respectively, with differing diameters, and/or respective insulation layers 162B, 164B and 166B with differing thicknesses.

The first insulation layer 158A may have a first thickness $T_1$, and the second insulation layer 158B may have a second thickness $T_2$. In at least some implementations, the first thickness $T_1$ may be different than the second thickness $T_2$. For example, in at least some implementations the first thickness may be approximately 0.5 millimeters (mm) and the second thickness $T_2$ may be approximately 2.5 mm.

Providing the three sensors $S_1$, $S_2$ and $S_3$ which differ from each other with respect to at least one characteristic (e.g., size, shape, distance from insulated conductor 106) which affects capacitive coupling with the insulated wire under test allows the non-contact voltage measurement system 102 to compensate for different variables which affect the capacitive coupling between the sensors and the insulated conductor 102. Such variables may include the diameter of the insulated conductor 106, the thickness of the insulation of the insulated conductor 106, the position of the insulated conductor 106 within the recessed portion 116 of the front end 112, etc.

Advantageously, by obtaining the voltage measurements for the voltages $V_1$, $V_2$ and $V_3$ at the sensors $S_1$, $S_2$ and $S_3$, respectively, at least one processor of the non-contact voltage measurement system 102 may accurately determine the AC voltage on the insulated conductor 106. To make such a determination, the non-contact voltage measurement system 102 may be calibrated (e.g., during manufacturing or design) using known insulated conductors 106 with known AC voltages. Additionally or alternatively, the at least one processor of the non-contact voltage measurement system 102 may utilize one or more determined equations with utilize the voltages $V_1$, $V_2$ and $V_3$ as inputs and provide the AC voltage of the insulated conductor 106 as an output. During operation, the at least one processor of the non-contact voltage measurement system 102 may obtain the voltages $V_1$, $V_2$ and $V_3$, and then determine the AC voltage in the insulated wire using a lookup table or one or more equations which receive the voltages as inputs and output the AC voltage in the insulated wire.

For the example sensor configuration shown in FIGS. 4A, 4B and 5, various relationships between the measured voltages $V_1$, $V_2$ and $V_3$ at the sensors $S_1$, $S_2$ and $S_3$, respectively may be used to determine the AC voltage of an insulated conductor under test. In at least some implementations, the non-contact voltage measurement system 102 may utilize one or more of the following relationships:

$$\frac{V_1}{V_2} \tag{1}$$

-continued $$V_1 + V_2 \quad (2)$$

$$V_1 + V_2 + V_3 \quad (3)$$

$$\frac{V_1 + V_2}{V_3} \quad (4)$$

The relationships (1)-(4) above may be used to provide a function for the unknown AC voltage in an insulated conductor (e.g., insulated conductor 106) that is independent of the distance between the insulated conductor and the sensors $S_1$, $S_2$ and $S_3$, such that the AC voltage in insulated conductors of various sizes may be measured.

For the sensors $S_1$ and $S_2$, the following equation may be used:

$$V_O = k \times (V_1 + V_2) \quad (5)$$

where $V_O$ is the AC voltage in the insulated conductor and k is a function of relationship (1) above (i.e., $k=f(V_1/V_2)$).

The measured voltages $V_1$, $V_2$ and $V_3$ are dependent on the capacitances $C_1$, $C_2$ and $C_3$ between the sensors $S_1$, $S_2$ and $S_3$, respectively, and the insulated conductor. Thus, the capacitances $C_1$, $C_2$ and $C_3$ may be calculated according to the known equation for the capacitance between a wire (e.g., an insulated conductor) that is parallel to a plane or wall (e.g., each of sensors $S_1$, $S_2$ and $S_3$). The equation for the capacitance C for each of the sensors is as follows:

$$C = \frac{2\pi\varepsilon l}{\cosh^{-1}\frac{d}{a}} = \frac{2\pi\varepsilon l}{\ln\left(\frac{d}{a} + \sqrt{\frac{d^2}{a^2} - 1}\right)} \quad (6)$$

where 'a' is the radius of the conductive wire, 'd' is the distance between the wire and the sensor (where 'd'>'a'), and 'l' is the length of the wire which is proximate the sensor or, equivalently, the width of the sensor.

As discussed above, the voltages $V_1$, $V_2$ and $V_3$ may be measured with suitable voltage measurement components 136A, 136B and 136C, respectively, such as one or more ADCs or one or more inverting operational amplifiers which convert the currents through each of the sensors $S_1$, $S_2$ and $S_3$ to respective voltages.

The above-listed relationships (1), (2) and (3) identify three equations which provide unique values for a given measurement of voltages $V_1$, $V_2$ and $V_3$ which identifies the diameter of the conductive wire under test as well as the insulation thickness of the conductive wire and can be used to calculate the capacitances $C_1$, $C_2$ and $C_3$ using equation (6) above. Then, the AC voltage in the insulated wire may be calculated according to the following equation:

$$I_x \sim V_x = \frac{V_O}{\frac{1}{j\omega C_x}} = V_O \times j\omega C_x \quad (7)$$

where 'x' is equal to 1, 2 and 3 for the sensors $S_1$, $S_2$ and $S_3$, respectively.

The three output voltages $V_1$, $V_2$ and $V_3$ of the three sensors $S_1$, $S_2$ and $S_3$ allow a characterization of the insulated wire under test by the diameter of the conductor and the thickness of the insulation. Relationship (1) above primarily defines the outer diameter of the insulated wire, and relationship (4) primarily defines the diameter of the conductor of the insulated wire. As discussed above, the voltages $V_1$, $V_2$ and $V_3$ are used as inputs to obtain a calibration factor from a lookup table or for calculating such utilizing one or more equations.

As an example, for a given measurement of voltages $V_1$, $V_2$ and $V_3$, using equation (6) above, relationship (1) limits the possible combinations of wire diameter and insulation thickness for the insulated wire under test. Similarly, relationship (2) limits the possible combinations of wire diameter and insulation thickness for the insulated wire under test. Thus, using relationships (1) and (2) a virtual wire having a specified wire diameter and specified insulation thickness may be determined. The physical properties of the determined virtual wire may be used to identify a factor which is dependent on both of the relationships (1) and (2) above. Using the determined virtual wire and the measured voltages $V_1$ and $V_2$, a calibration table that is generated by different positions of the insulated wire under test provides the final voltage result independent of position.

Using only the voltages $V_1$ and $V_2$, the result may provide inaccurate values. Thus, the voltage $V_3$ from the sensor $S_3$ may be used in a similar manner to that described above to provide better position definition. Notably, relationship (4) utilizes the sum of the voltages $V_1$ and $V_2$. Since the shape of the sensors $S_1$ and $S_2$ when combined together are similar to the shape of the sensor $S_3$, relationship (4) provides a ratio for similar capacitors (i.e., $C_1+C_2$ and $C_3$) at two different distances (i.e., $T_1$ and $T_2$).

The actual sizes and shapes of the sensors $S_1$, $S_2$ and $S_3$ may be selected to achieve reasonable capacitances (e.g., a few picofarads) between the sensors and the insulated conductor under test, and also to be much less than the body capacitance (CB) (e.g., 30 to 200 picofarads), which may be used as a possible reference to earth ground for handheld applications.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact voltage measurement system may not utilize a processor to execute instructions. For example, a non-contact voltage measurement system may be hardwired to provide some or all of the functionality discussed herein. Additionally, in at least some implementations a non-contact voltage measurement system may not utilize a processor to cause or initiate the different measurements discussed herein. For example, such non-contact voltage measurement system may rely on one or more separate inputs, such as a user-actuated button which causes measurements to occur.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and nonpatent publications referred to in this specification and/or listed in the Application Data Sheet, including but not limited to U.S. Provisional Patent Application No. 62/421,124, filed Nov. 11, 2016, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system to measure alternating current (AC) voltage in an insulated conductor, the system comprising:
   a housing;
   a sensor assembly physically coupled to the housing, the sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling;
   a voltage measurement subsystem electrically coupled to the first, second and third conductive sensors, wherein the voltage measurement subsystem, in operation, generates first, second and third sensor voltage signals that are indicative of voltages at the first, second and third conductive sensors, respectively; and
   at least one processor communicatively coupled to the voltage measurement subsystem, wherein, in operation, the at least one processor:
      receives the first, second and third sensor voltage signals from the voltage measurement subsystem; and
      determines the AC voltage in the insulated conductor based at least in part on the received first, second and third sensor voltage signals.

2. The system of claim 1 wherein the at least one characteristic which affects capacitive coupling comprises at least one physical dimension.

3. The system of claim 1 wherein the at least one characteristic which affects capacitive coupling comprises at least one of physical area, physical orientation, or physical separation from the insulated conductor when the sensor assembly is positioned proximate the insulated conductor.

4. The system of claim 1 wherein each of the first and second conductive sensors has a planar right triangular shape which defines a first edge and a second edge that form a right angle, and a hypotenuse edge opposite the right angle, and the hypotenuse edges of the first conductive sensor and the second conductive sensor are positioned proximate each other.

5. The system of claim 4 wherein the third conductive sensor has a planar rectangular shape.

6. The system of claim 5 wherein the first and second conductive sensors are positioned in a first plane and the third conductive sensor is positioned in a second plane, and the first plane is disposed at an acute angle with respect to the second plane.

7. The system of claim 6 wherein the first plane is disposed at an angle with respect to the second plane which is between 20 degrees and 50 degrees.

8. The system of claim 1 wherein the sensor assembly comprises:
   a first insulation layer which insulates the first and second conductive sensors from the insulated conductor when the sensor assembly is positioned proximate the insulated conductor, the first insulation layer having a first thickness; and
   a second insulation layer which insulates the third conductive sensor from the insulated conductor when the sensor assembly is positioned proximate the insulated conductor, the second insulation layer having a second thickness that is different from the first thickness.

9. The system of claim 8 wherein the first thickness of the first insulation layer is less than the second thickness of the second insulation layer.

10. The system of claim 1, further comprising at least one internal ground guard which at least partially surrounds each of the first, second and third conductive sensors.

11. The system of claim 1 wherein the at least one processor determines at least one of:
   the first sensor voltage signal divided by the second sensor voltage signal;
   the sum of the first sensor voltage signal and the second sensor voltage signal; and
   the sum of the first sensor voltage signal, second sensor voltage signal and the third sensor voltage signal.

12. The system of claim 11 wherein the at least one processor determines the sum of the first sensor voltage signal and the second sensor voltage signal divided by the third sensor voltage signal.

13. The system of claim 1 wherein the at least one processor compares at least one value derived from the first, second and third sensor voltage signals to a lookup table to determine the AC voltage in the insulated conductor based at least in part on the received first, second and third sensor voltage signals.

14. The system of claim 1 wherein the at least one processor evaluates at least one equation using at least one value derived from the first, second and third sensor voltage signals to determine the AC voltage in the insulated conductor based at least in part on the received first, second and third sensor voltage signals.

15. A method of operating a system to measure alternating current (AC) voltage in an insulated conductor, the system comprising a housing, a sensor assembly physically coupled to the housing, the sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling, the method comprising:
generating, via a voltage measurement subsystem electrically coupled to the first, second and third conductive sensors, first, second and third sensor voltage signals that are indicative of voltages at the first, second and third conductive sensors, respectively;
receiving, by at least one processor communicatively coupled to the voltage measurement subsystem, the first, second and third sensor voltage signals from the voltage measurement subsystem; and
determining, by the at least one processor, the AC voltage in the insulated conductor based at least in part on the received first, second and third sensor voltage signals.

16. The method of claim 15 wherein determining the AC voltage in the insulated conductor comprises determining at least one of:
the first sensor voltage signal divided by the second sensor voltage signal;
the sum of the first sensor voltage signal and the second sensor voltage signal; and
the sum of the first sensor voltage signal, second sensor voltage signal and the third sensor voltage signal.

17. The method of claim 15 wherein determining the AC voltage in the insulated conductor comprises determining the sum of the first sensor voltage signal and the second sensor voltage signal divided by the third sensor voltage signal.

18. The method of claim 15 wherein determining the AC voltage in the insulated conductor comprises comparing at least one value derived from the first, second and third sensor voltage signals to a lookup table to determine the AC voltage in the insulated conductor based at least in part on the received first, second and third sensor voltage signals.

19. The method of claim 15 wherein determining the AC voltage in the insulated conductor comprises evaluating at least one equation using at least one value derived from the first, second and third sensor voltage signals to determine the AC voltage in the insulated conductor based at least in part on the received first, second and third sensor voltage signals.

20. A method of providing a system to measure alternating current (AC) voltage in an insulated conductor, the method comprising:
providing a sensor assembly selectively positionable proximate the insulated conductor without galvanically contacting the conductor, the sensor assembly comprising a first conductive sensor, a second conductive sensor, and a third conductive sensor, wherein the first, second and third conductive sensors each capacitively couple with the insulated conductor when the sensor assembly is positioned proximate the insulated conductor, and each of the first, second and third conductive sensors differs from the other of the conductive sensors with respect to at least one characteristic which affects capacitive coupling;
generating, via a voltage measurement subsystem electrically coupled to the first, second and third conductive sensors, first, second and third sensor voltage signals that are indicative of voltages at the first, second and third conductive sensors, respectively;
receiving, by at least one processor communicatively coupled to the voltage measurement subsystem, the first, second and third sensor voltage signals from the voltage measurement subsystem; and
determining, by the at least one processor, the AC voltage in the insulated conductor based at least in part on the received first, second and third sensor voltage signals.

21. The method of claim 20 wherein providing a sensor assembly comprises providing a sensor assembly that includes first, second and third conductive sensors, and each of the first, second and third conductive sensors differs from the other of the conductive sensors with respect to at least one physical dimension.

22. The method of claim 20 wherein providing a sensor assembly comprises providing a sensor assembly that includes first, second and third conductive sensors, and each of the first, second and third conductive sensors differs from the other of the conductive sensors with respect to at least one of physical area, physical orientation, or physical separation from the insulated conductor when the sensor assembly is positioned proximate the insulated conductor.

23. The method of claim 20 wherein providing a sensor assembly comprises providing a sensor assembly that includes first, second and third conductive sensors, and each of the first and second conductive sensors has a planar right triangular shape which defines a first edge and a second edge that form a right angle, and a hypotenuse edge opposite the right angle, and the hypotenuse edges of the first conductive sensor and the second conductive sensor are positioned proximate each other.

24. The method of claim 23 wherein providing a sensor assembly comprises providing a sensor assembly that includes first, second and third conductive sensors, and the third conductive sensor has a planar rectangular shape.

25. The method of claim 24 wherein providing a sensor assembly comprises providing a sensor assembly that includes first, second and third conductive sensors, and the first and second conductive sensors are positioned in a first plane and the third conductive sensor is positioned in a second plane, and the first plane is disposed at an acute angle with respect to the second plane.

26. The method of claim 20, further comprising:
providing a first insulation layer which insulates the first and second conductive sensors from the insulated conductor when the sensor assembly is positioned proximate the insulated conductor, the first insulation layer having a first thickness; and
providing a second insulation layer which insulates the third conductive sensor from the insulated conductor when the sensor assembly is positioned proximate the insulated conductor, the second insulation layer having a second thickness that is different from the first thickness.

27. The method of claim 20, further comprising providing at least one internal ground guard which at least partially surrounds each of the first, second and third conductive sensors.

* * * * *